United States Patent
Ogata et al.

(10) Patent No.: US 7,847,271 B2
(45) Date of Patent: Dec. 7, 2010

(54) ION IMPLANTING APPARATUS

(75) Inventors: Seiji Ogata, Chigasaki (JP); Ryota Fukui, Susono (JP); Hidekazu Yokoo, Susono (JP); Tsutomu Nishihashi, Susono (JP)

(73) Assignee: Ulvac Inc., Chigasaki (JP)

( * ) Notice: Subject to any disclaimer, the term of this patent is extended or adjusted under 35 U.S.C. 154(b) by 59 days.

(21) Appl. No.: 12/279,653

(22) PCT Filed: Feb. 15, 2007

(86) PCT No.: PCT/JP2007/052778

§ 371 (c)(1),
(2), (4) Date: Sep. 24, 2008

(87) PCT Pub. No.: WO2007/094432

PCT Pub. Date: Aug. 23, 2007

(65) Prior Publication Data

US 2009/0072164 A1    Mar. 19, 2009

(30) Foreign Application Priority Data

Feb. 17, 2006   (JP)   .............................. 2006-041408

(51) Int. Cl.
*H01J 37/317* (2006.01)
*H01J 37/256* (2006.01)

(52) U.S. Cl. ............... 250/492.21; 250/396 R; 250/396 ML; 250/298; 250/294; 250/281

(58) Field of Classification Search ............ 250/492.21, 250/396 ML, 396 R, 298, 294, 281
See application file for complete search history.

(56) References Cited

U.S. PATENT DOCUMENTS

| 5,907,158 | A  | * | 5/1999 | Nasser-Ghodsi et al. .................... 250/492.21 |
| 6,338,312 | B2 | * | 1/2002 | Hayes et al. .......... 118/723 CB |
| 6,956,225 | B1 | * | 10/2005 | Benveniste ............. 250/492.21 |
| 7,329,882 | B2 | * | 2/2008 | Rathmell et al. ....... 250/492.21 |

FOREIGN PATENT DOCUMENTS

| JP | 62 295347 | 12/1987 |
| JP | 4 253149 | 9/1992 |
| JP | 5 211128 | 8/1993 |
| JP | 8 240700 | 9/1996 |
| JP | 2003 208869 | 7/2003 |
| WO | 00 41206 | 7/2000 |

* cited by examiner

*Primary Examiner*—Nikita Wells
(74) *Attorney, Agent, or Firm*—Oblon, Spivak, McClelland, Maier & Neustadt, L.L.P.

(57) ABSTRACT

An ion implanter for manufacturing a single crystal film by extracting a hydrogen ion or a rare-gas ion from an ion source, selects a desired ion with a first sector electromagnet, scanning the ion with a scanner, collimates the ion with a second sector electromagnet, and implants it into a substrate; the ion source is configured to be located close to the entrance side focal point of the first sector electromagnet. In this case, when an aperture of an extraction section of the ion source is circular and entrance side focal points in a deflection surface and a surface perpendicular thereto in the first sector electromagnet are coincident, the ion beam after passing the first sector electromagnet becomes completely parallel in the two surfaces and the spot shape becomes a circle.

4 Claims, 12 Drawing Sheets

10: Ion Implanter
12: Ion Source
14: First Sector Electromagnet
16: Scanner
18: Second Sector Electromagnet
20: Substrate
B: Ion Beam
F1, F2: Focal Points 10: Ion Implanter
12: Ion Source
14: First Sector Electromagnet
16: Scanner
18: Second Sector Electromagnet
20: Substrate
B: Ion Beam
F1, F2: Focal Points

ION IMPLANTING APPARATUS

TECHNICAL FIELD

The present invention relates to an ion implanter for manufacturing a single crystal film. Specifically, the present invention relates to a small-size ion implanter for manufacturing a single crystal film with stabilized parallelism of an ion beam and precise control of a density distribution.

BACKGROUND ART

Patent document 1 discloses a method for manufacturing a single crystal film with a predetermined thickness by implanting the predetermined hydrogen ions or rare-gas ions with a predetermined energy into a substrate to generate a minute bubble layer at a prescribed depth of the substrate.

Since this method for manufacturing a single crystal film needs to implant hydrogen ions or rare-gas ions in large quantity, a high current ion implanter is usually used as such an implanter.

Hereafter, first through fourth conventional examples concerning this high current ion implanter will be described using FIG. 7 through FIG. 12.

FIRST CONVENTIONAL EXAMPLE

A batch-processing high current ion implanter in which 10 to 20 pieces of substrates are fixed to a disk that rotates mechanically and a mass-separated ion beam is irradiated onto the substrates is mainly used as a conventional high current ion implanter.

An example of the batch-processing high current ion implanter is described in non-patent document 1.

This conventional batch-processing high current ion implanter will be described using FIG. 7.

FIG. 7 is a plan view showing an outline configuration of the batch-processing high current ion implanter of the first conventional example.

In the batch-processing high current ion implanter 100 of this conventional example, an ion beam B extracted from an ion source 102 is separated by a sector electromagnet 104 for mass separation and a mass separating slit 106 that is located on an imaging position of the ion source 102 formed by the sector electromagnet 104, and then, a predetermined ionic species is selected.

Hereafter, "the sector electromagnet for mass separation" may be called "the mass separator".

A plurality of substrates 110 located on a mechanically rotating substrate holder 108 are irradiated with the selected ion beam B.

A slow movement of a rotation shaft 109 of the substrate holder 108 in a left-and-right direction in the drawing sheet uniforms the irradiation of the ion beam B onto the substrates 110.

SECOND CONVENTIONAL EXAMPLE

However, a problem for the configuration of the batch-processing high current ion implanter of the first conventional example is that the device becomes larger as the substrate becomes larger.

In order to overcome the problem to increase the size of the ion implanter as a semiconductor substrate or a flat panel display substrate becomes larger, a single-wafer-processing high current ion implanter in which the mass separated ion beam is irradiated on the substrates one by one is also used in recent years. A single-wafer-processing high current ion implanter may be used for the process of manufacturing a single crystal film from now on.

A published conventional example of a single-wafer-processing high current ion implanter is described in a non-patent document 2.

The single-wafer-processing high current ion implanter of the second conventional example will be described using FIG. 8.

FIG. 8 is a plan view showing an outline configuration of the single-wafer-processing high current ion implanter of the second conventional example.

In the single-wafer-processing high current ion implanter 120 of the second conventional example, an ion beam B extracted from an ion source 122 is separated by a sector electromagnet 124 for mass separation and a mass separating slit 126 that is located on a imaging position of the ion source 122 formed by the sector electromagnet 124 in the same manner as the batch-processing high current ion implanter 100, and then, a predetermined ionic species is selected.

The selected ion beam B is converted into a parallel beam B by a collimator electromagnet 128 installed ahead, and a substrate 110 is irradiated with the parallel beam B at a fixed angle.

Here, the "ahead" means the traveling direction of the ion beam B.

In this conventional example, the substrate 110 is mechanically driven in the perpendicular direction to the drawing sheet.

Hereafter, the "collimator electromagnet" may be called a "collimator device".

THIRD CONVENTIONAL EXAMPLE

However, a problem of the single-wafer-processing high current ion implanter of the second conventional example is that a density distribution of the ion beam irradiated on the substrate is uncontrollable.

A conventional example of a single-wafer-processing high current ion implanter for solving this problem is described in a non-patent document 3.

This conventional single-wafer-processing high current ion implanter of the third conventional example will be described using FIG. 9.

FIG. 9 is a plan view showing an outline configuration of the single-wafer-processing high current ion implanter of the third conventional example.

In the single-wafer-processing high current ion implanter 130 of the third conventional example, a sector electromagnet 134 for mass separation and collimation is installed ahead of an ion source 132, and a density control electromagnet 136 formed of a multipole electromagnet is installed ahead. A substrate 110 is located ahead of them.

In the single-wafer-processing high current ion implanter 130 of the third conventional example, the density distribution of the ion beam B can be controlled by the density control electromagnet 136.

Supplemental remarks about a principle for controlling the density distribution of the ion beam B irradiated onto the substrate 110 by the function of the density control electromagnet 136 will be described using FIG. 10 and FIG. 11.

FIG. 10 is a plan view for explaining the principle to control a density distribution of the ion beam B, when the density of the ion beam in the upper portion in the drawing sheet is higher.

FIG. 11 is a plan view for explaining the principle to control a density distribution of the ion beam B, when the density control electromagnet 136 adjusts so that the density distribution becomes uniform.

First, as shown in FIG. 10, it is assumed that the density of the ion beam B is high in the upper portion in the drawing sheet.

In this case, as shown in FIG. 11, when a correction magnetic field H is generated with the density control electromagnet 136, the density distribution is controllable so that the density of the ion beam B irradiated onto the substrate 110 becomes uniform.

FOURTH CONVENTIONAL EXAMPLE

Incidentally, the single-wafer-processing high current ion implanter of the third conventional example mentioned above solved the problem that the single-wafer-processing high current ion implanter of the second conventional example could not control the density distribution of the ion beam irradiated onto the substrate. However, with this configuration, as shown in FIG. 11, when the density of the ion beam B is corrected, there is a problem that the parallelism of the ion beam B is lost inevitably.

In order to control the density distribution of the ion beam irradiated on a substrate, without loss of the parallelism of an ion beam, an apparatus as shown in FIG. 12 is easily considered as a fourth configuration.

A high current ion implanter of this fourth configuration will be described using FIG. 12.

FIG. 12 is a plan view showing an outline configuration of the single-wafer-processing high current ion implanter of the fourth conventional example.

As shown in FIG. 12, a configuration of the single-wafer-processing high current ion implanter 140 of the fourth conventional example, from an ion source 142 to a mass separating slits 144, is equivalent to the configuration in FIG. 7 and FIG. 8. A numeral 143 denotes a mass separator.

On the other hand, in the single-wafer-processing high current ion implanter 140 of the fourth conventional example, a scanner 147 for scanning the ion beam B is installed ahead of the mass separating slit 144. The ion beam B scanned here is collimated by a collimator electromagnet 148 and is irradiated onto a substrate 110.

With this configuration, since the ion beam B exited from the mass separating slit 144 is in a diverging condition, it is necessary to employ a convergent lens 145 such as a magnetic quadrupole lens.

In this case, the density distribution is precisely controllable by adjusting the scanning wave in the scanner 147.
[Patent document 1]
Japanese unexamined patent publication No. 05-211128
[Non-patent document 1]
H. Sundstrom et al. Proceedings of 1998 Int. Conf. on Ion Implantation Technology, (1999) 184—
[Non-patent document 2]
G. Angle et al. Proceedings of 1998 Int. Conf. on Ion Implantation Technology, (1999) 188—
[Non-patent document 3]
S. Satoh et al. Proceedings of 1998 Int. Conf. on Ion Implantation Technology, (1999) 138—

DISCLOSURE OF THE INVENTION

Problem to be Solved by the Invention

Incidentally, the single-wafer-processing high current ion implanter of the fourth conventional example can precisely control the density distribution by adjusting the scanning wave in the scanner as described above. Simultaneously, with this configuration, since the ion beam exited from the mass separating slits is in a diverging condition, it is necessary to employ the convergent lens such as a magnetic quadrupole lens.

Therefore, the configuration of the single-wafer-processing high current ion implanter of the fourth conventional example must reserve the installing space for the convergent lens, which causes a problem that the device becomes long.

On the other hand, the high current ion implanters of the first through third conventional examples have their own problems as mentioned above. Therefore, the conventional small configurations cannot control the density distribution without loss of the parallelism of an ion beam.

It is an object of the present invention to provide an ion implanter, which is compact and can precisely control the density distribution without loss of the parallelism of an ion beam, for manufacturing a single crystal film.

Means for Solving Problem

An ion implanter for manufacturing a single crystal film in an aspect of the present invention extracts hydrogen ions or rare-gas ions from an ion source, selects desired ions by a mass separator, scans said ions with a scanner, collimates said ions with a collimator device, and implants them into a substrate, characterized in that said ion source is located close to the entrance side focal point of said mass separator.

An ion implanter in another aspect is constituted so that a first sector electromagnet is used as said mass separator and a second sector electromagnet is used as said collimator device.

An ion implanter in another aspect is constituted so that an aperture of an extraction section of said ion source is circular and entrance side focal points in a deflection surface and a surface perpendicular thereto in said mass separator are coincident.

Effect of the Invention

Since the ion implanter of the present invention is constituted as mentioned above, it has the following outstanding effects.
(1) With the configuration, the density distribution of the ion beam on the substrate can be controlled without loss of the parallelism of the ion beam that is incident into the substrate because of the structure to scan the ion beam.
(2) Since a lens for adjustment such as a quadrupole lens is unnecessary because a parallel beam is obtained by passing through the mass separator, the device can be small.
(3) With the configuration, the ion implanter that includes the suitable mass separator and the collimator device can be obtained.
(4) With the configuration, the spot shape of the ion beam after passing the collimator device shows a circle, and the ion beam becomes completely parallel in two surfaces, which include a deflection surface and the surface that intersects perpendicularly with the deflection surface.

BEST MODE FOR CARRYING OUT THE INVENTION

First and second embodiments of the ion implanter for manufacturing a single crystal film (hereinafter, it may be simply called an "ion implanter") according to the present invention will be described in turn using FIG. 1 through FIG. 6.

First Embodiment

To begin with, a first embodiment of the ion implanter of the present invention is described using FIG. 1 and FIG. 2.

FIG. 1 is a plan view showing an outline configuration of the ion implanter of the first embodiment according to the present invention.

FIG. 2 is a plan view of the ion implanter of the first embodiment according to the present invention for explaining a principle to obtain sufficient mass resolution of an ion beam.

First, a basic configuration and a constitutional feature of the ion implanter 10 of this embodiment are explained using FIG. 1.

As shown in FIG. 1, the basic configuration of the ion implanter 10 of this embodiment includes an ion source 12, a first sector electromagnet 14 as a mass separator for the ion beam B, a scanner 16, and a second sector electromagnet 18 as a collimator device for the ion beam B.

In general, a sector electromagnet like the first and second sector electromagnets 14 and 18 shown in FIG. 1 has a function as a convergent lens to converge the ion beam B.

That is, owing to a difference between orbits when passing through the sector electromagnet, ions traveling through an outside area of a center orbit of the ion beam B are sharply deflected by the sector electromagnet, and ions traveling through an inside area of the center orbit of the ion beam B are slightly deflected by the sector electromagnet, on the other hand. As a result, the ions traveling through the both sides are converged in the direction toward the center orbit, it has the same function that an optical lens converges light beam.

Further, a lens function also occurs in a surface being perpendicular to the deflection surface under the influence of an oblique magnetic field.

Then, as shown in FIG. 1, an entrance side focal point of the first sector electromagnet 14 is shown by F1 and an entrance side focal point of the second sector electromagnet 16 is shown by F2 with respect to the deflection surface.

In the above configuration, the features of the ion implanter 10 of this embodiment are that: the ion source 12 is located close to the entrance side focal point F1 of the first sector electromagnet 14 for mass separation for the ion beam B; the scanner 16 is installed ahead of the first sector electromagnet 14; the second sector electromagnet 16 for collimating the ion beam B is installed ahead of them; and the substrate 20 is located ahead of them.

Further, the position of the second sector electromagnet 18 is arranged so that the entrance side focal point F2 is coincident with the deflection center in the scanner 16.

Accordingly, the angle of the ion beam B passing through the second sector electromagnet 18 becomes constant without being dependent on the scanning angle in the scanner 16.

Still further, the substrate 20 is driven in the perpendicular direction to the drawing sheet of FIG. 1 by a mechanism that is not illustrated.

Next, reasons why the ion implanter 10 of this embodiment solves the problems of the conventional devices, becomes small, and can precisely control the density distribution with stabilized parallelism of an ion beam, will be explained.

For example, in the ion implanter 100 of the conventional configuration as shown in FIG. 7, the position of the ion source 102 is arranged far from the entrance side focal point of the first sector electromagnet 104 in order to obtain high mass resolution. A real image of the ion source 102 is formed ahead of the first sector electromagnet 104.

However, unlike this, in the ion implanter 10 of this embodiment, since the ion source 12 is located close to the entrance side focal point F1 of the first sector electromagnet 14, the ion beam B exited from the first sector electromagnet 14 is a substantially parallel beam.

In general, it is preferable that the ion beam B being incident into the scanner 16 is parallel or shows slightly convergent tendency.

For this reason, the conventional ion implanter 140 as shown in FIG. 12 needs the optical element 145 with a convex lens function such as a quadrupole lens for re-converging the ion beam B that is once imaged on the mass separating slit 144.

On the contrary, since the exited ion beam B from the first sector electromagnet 14 is approximately parallel, the ion implanter 10 of this embodiment has an advantage that it is unnecessary to install an optical element having a convex lens function upstream of the scanner 16.

Therefore, the size of the device can be reduced by the installing space of the optical element and the distance between the ion source 12 and the entrance side focal point F1 of the first sector electromagnet 14.

On the other hand, the optical system that does not form an image of the ion beam B such as an ion implanter 10 of this embodiment has a problem that a high mass resolution to derive the mass ratio M/□M of 50 or more, which is required in a conventional ion implanter, cannot be obtained.

Therefore, the ion implanter 10 of this embodiment limits the ionic species to be implanted into the substrate 20 in order to obtain a sufficient mass resolution of the ion beam B. This reason is explained using FIG. 2.

As mentioned above, the ion used for single crystal film manufacture is a hydrogen ion and rare-gas ion.

In the case of a hydrogen ion, it is sufficient to isolate a diatomic molecule ion H2+ from single atomic ion H+ and triatomic-molecule ion H3+. In the case of rare gas, for example, helium He, it is sufficient to isolate a divalent ion $He^{2+}$ from a dyad excimer ion He2+. Therefore, even if an image of the ion source 12 is not formed as in the ion implanter 10 of this embodiment, sufficient mass separation is possible.

This reason is explained using FIG. 2.

As a concrete example, when the deflection angle θ, an oblique incident angle α, and an oblique exit angle β of the first sector electromagnet 14 are set to 90 degrees, 45 degrees, and 20 degrees, respectively, the entrance side focal point D1 in the deflection surface can be approximately coincident with the entrance side focal point D2 in the surface perpendicular to the deflection surface.

In addition, a method to bring the entrance side focal point D1 in the deflection surface to be coincident with the entrance side focal point D2 in the surface perpendicular to the deflection surface will be explained in a second embodiment below.

In FIG. 2, when a turning radius R in the first sector electromagnet 14 is set to 350 mm, a distance L1 to the entrance side focal point D1 equals about 200 mm.

Assuming that the passing ion is H2+, a deviation δx from the axis becomes 140 mm at the position where the distance L2 from the first sector electromagnet 14 is 300 mm, even in the case of H3+ with the smallest difference of the turning radius R.

Since the normal beam width W is about at most 60 mm, this configuration is sufficient to carry out the mass separation of the ion beam B.

Therefore, in the configuration of the conventional ion implanter 140 as shown in FIG. 12, the traveling distance of the ion beam B from the ion source 142 to the substrate 110 reaches about 5 to 6 meters.

On the other hand, in the configuration of the ion implanter 10 of this embodiment, the traveling distance of the ion beam B from the ion source 12 to the substrate 20 is about 3 meters, which can be shortened to half, with maintaining the sufficient mass resolution of the ion beam B for manufacturing a single crystal film.

Second Embodiment

Next, a second embodiment of the ion implanter of the present invention will be described using FIG. 3 through FIG. 6.

FIG. 3 and FIG. 4 are drawings for explaining orbits of ion beams in a general sector electromagnet, when an ion source is located at an entrance side focal point of a deflection surface. FIG. 3 is an explanatory drawing in the deflection surface and FIG. 4 is an explanatory drawing in the surface that intersects perpendicularly with the deflection surface.

FIG. 5 and FIG. 6 are drawings for explaining orbits of ion beams in the second embodiment of the ion implanter according to the present invention, when entrance side focal points are coincident in two surfaces, which include a deflection surface and the surface that intersects perpendicularly with the deflection surface. FIG. 5 is an explanatory drawing in the deflection surface and FIG. 6 is an explanatory drawing in the surface that intersects perpendicularly with the deflection surface.

To begin with, the basic configuration and the constitutional features of the ion implanter 20 of this embodiment are described. While the basic configuration is the same as the basic configuration of the ion implanter 10 of the first embodiment, the constitutional features are that the entrance side focal points are coincident in the two surfaces including the deflection surface and the surface perpendicular to the deflection surface, and the aperture of the extracting section 22a of the ion source 22 is circular.

In general, in the sector electromagnet 34, as shown in FIG. 3 and FIG. 4, the positions of the entrance side focal points D1 and D2 in the deflection surface and the surface perpendicular to the deflection surface are different in their positions.

For this reason, if the ion source 32 is located at the entrance side focal point D1 in the deflection surface, the ion beam B after passing through the sector electromagnet 34 does not becomes a parallel beam in the surface perpendicular to the deflection surface as shown in FIG. 4.

For this reason, an adjusting lens such as a quadrupole lens is required in order to obtain a parallel beam in the two surfaces including the deflection surface and the surface perpendicular to the deflection surface, in general.

However, as described below, when the entrance side focal points D1 and D2 are coincident in the two surfaces, the ion beam B after passing through the sector electromagnet 24 becomes completely parallel in both the directions as shown in FIG. 5 and FIG. 6.

When the aperture of the extraction section 22a of the ion source 22 is circular, the divergent angles of the ion beams B extracted from the ion source 22 in the two surfaces are coincident. Therefore, the ion beam B after passing the sector electromagnet 24 becomes completely parallel and the spot shape becomes a circle.

Next, a method to bring the entrance side focal points D1 and D2 to coincidence in the two surfaces will be explained briefly.

The positions of the entrance side focal points D1 and D2 in two surfaces, which include the deflection surface and the surface that intersects perpendicularly with the deflection surface, are determined based on four factors that are a turning radius R, a deflection angle θ, an oblique incident angle α, and an oblique exit angle β.

Some combinations about the conditions where the entrance side focal points are coincident in the two surfaces when the deflection angle θ is 90 degrees are shown in Table 1.

Adjustments of the oblique incident angle α and oblique exit angle β according to the data in Table 1 enables coincidence of the entrance side focal points D1 and D2 in the two surfaces.

In addition, this condition does not depend on the turning radius R.

TABLE 1

| Oblique incident angle α | Oblique exit angle β |
| --- | --- |
| 0.0° | 25.9° |
| 5.0 | 25.5 |
| 10.0 | 25.1 |
| 15.0 | 24.6 |
| 20.0 | 24.1 |
| 25.0 | 23.5 |
| 30.0 | 22.8 |
| 35.0 | 21.9 |
| 45.0 | 19.6 |
| 50.0 | 18.1 |

EXPLANATIONS OF LETTERS OR NUMERALS

Figure 1:
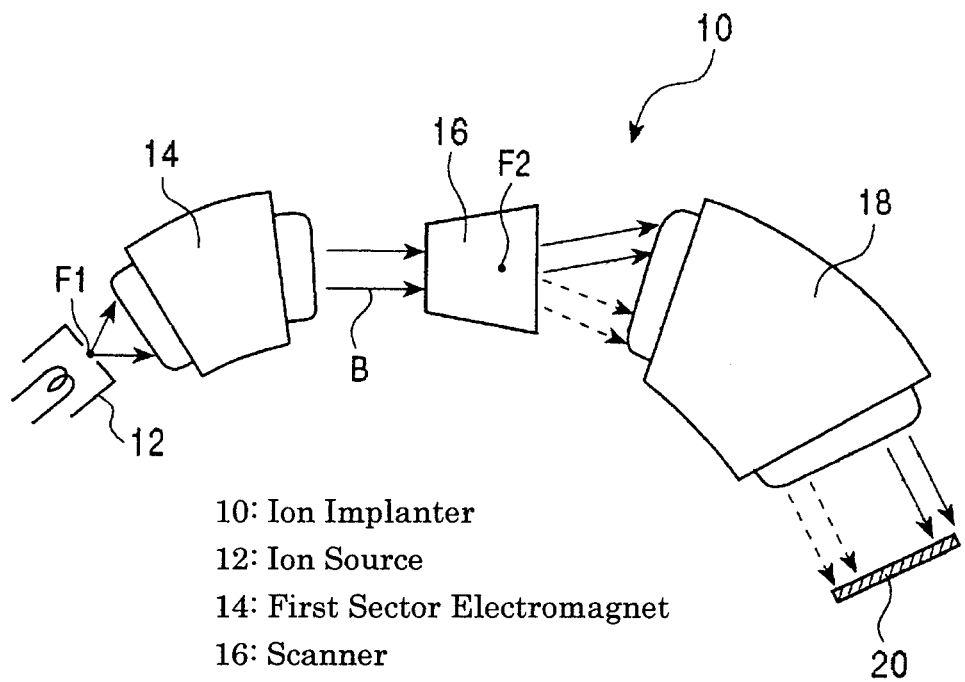
[FIG. 1] A plan view showing an outline configuration of the ion implanter of the first embodiment according to the present invention.
Figure 2:
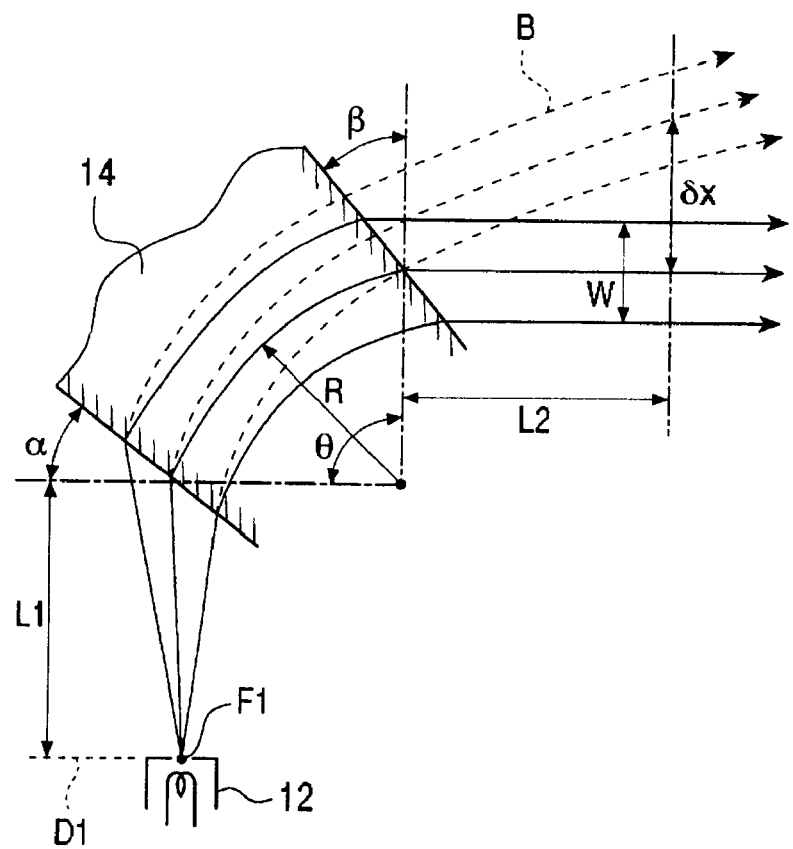
[FIG. 2] A plan view of the ion implanter of the first embodiment according to the present invention for explaining a principle to obtain sufficient mass resolution of an ion beam.
Figure 3:
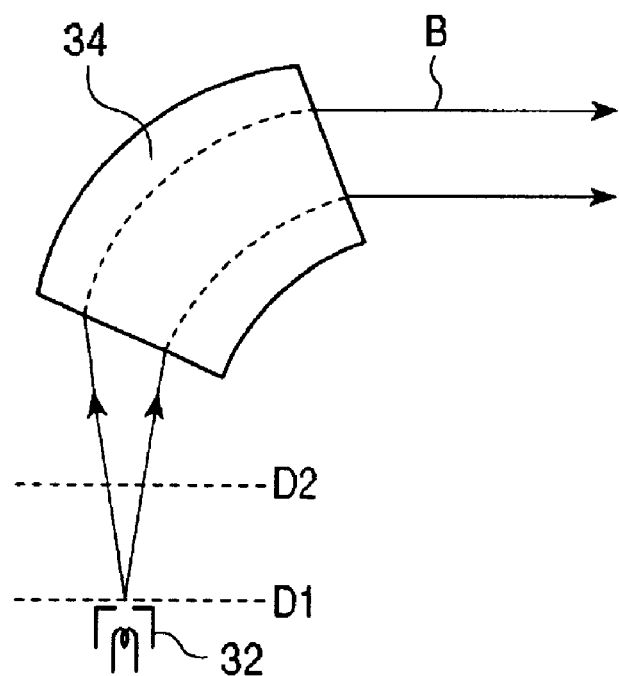
[FIG. 3] A drawing for explaining an orbit of an ion beam in a general sector electromagnet, when an ion source is located at an entrance side focal point of a deflection surface; and an explanatory drawing in the deflection surface.
Figure 4:
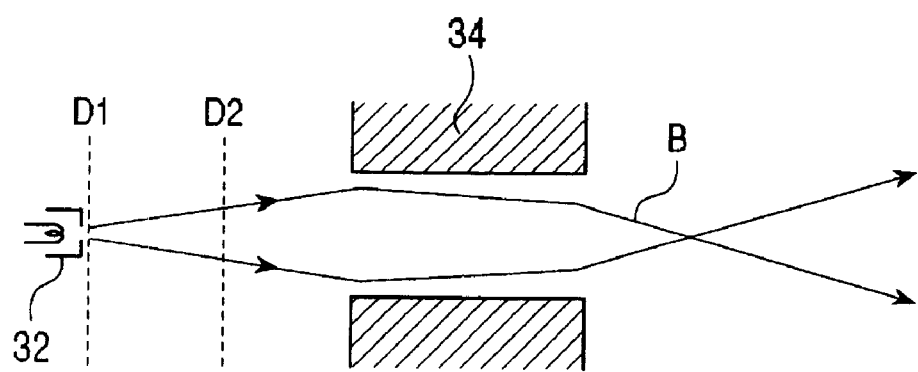
[FIG. 4] A drawing for explaining an orbit of an ion beam in a general sector electromagnet, when an ion source is located at an entrance side focal point of a deflection surface; and an explanatory drawing in the surface that intersects perpendicularly with the deflection surface.
Figure 5:
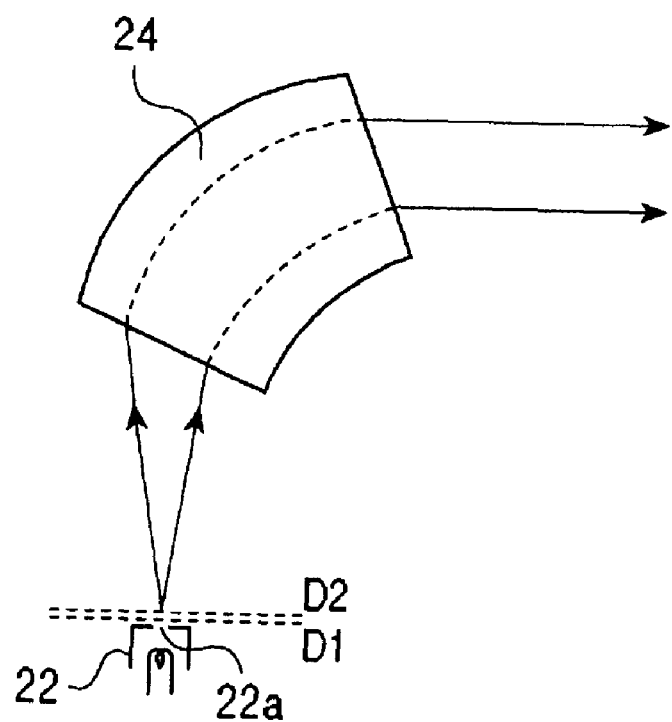
[FIG. 5] A drawing for explaining an orbit of an ion beam in the second embodiment of the ion implanter according to the present invention, when entrance side focal points are coincident in two surfaces, which include a deflection surface and the surface that intersects perpendicularly with the deflection surface; and an explanatory drawing in the deflection surface.
Figure 6:
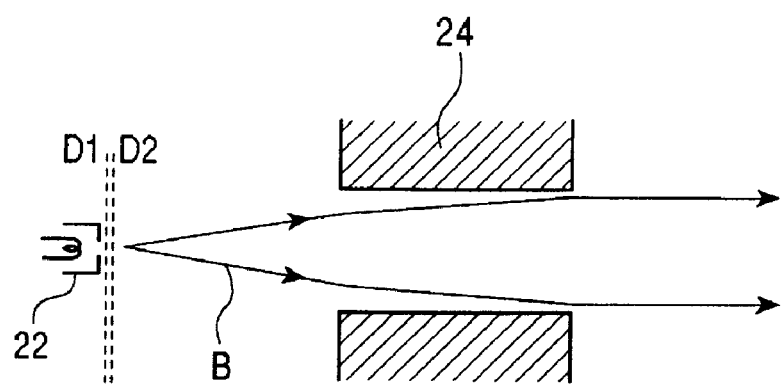
[FIG. 6] A drawing for explaining an orbit of an ion beam in the second embodiment of the ion implanter according to the present invention, when entrance side focal points are coincident in two surfaces, which include a deflection surface and the surface that intersects perpendicularly with the deflection surface; and an explanatory drawing in the surface that intersects perpendicularly with the deflection surface.
Figure 7:
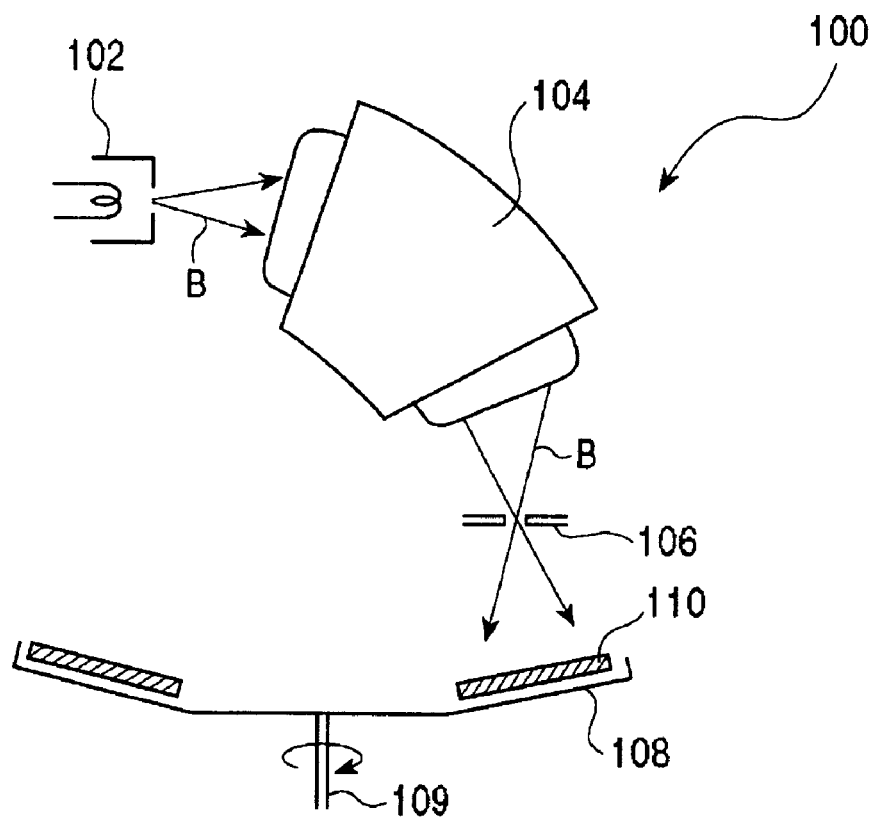
[FIG. 7] A plan view showing an outline configuration of the batch-processing high current ion implanter of the first conventional example.
Figure 8:
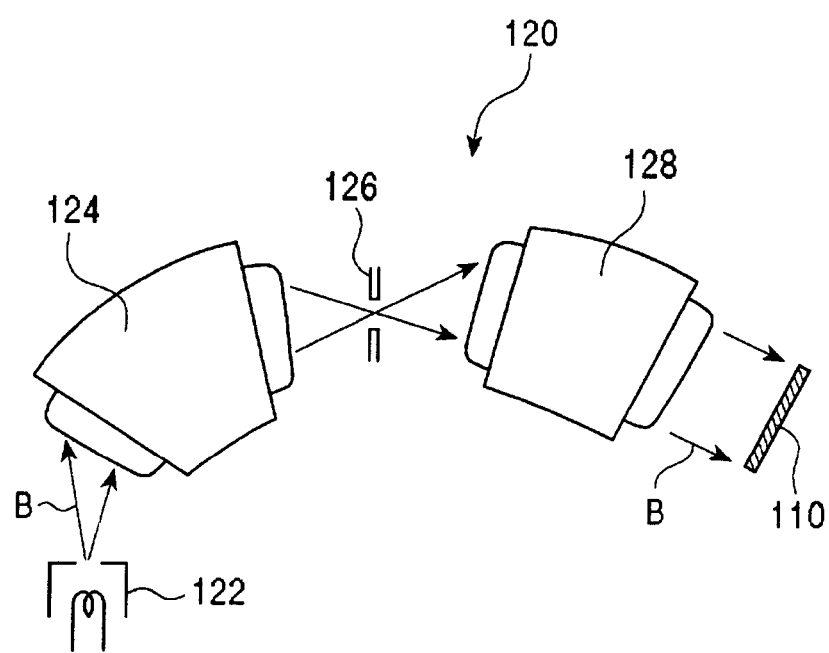
[FIG. 8] A plan view showing an outline configuration of the single-wafer-processing high current ion implanter of the second conventional example.
Figure 9:
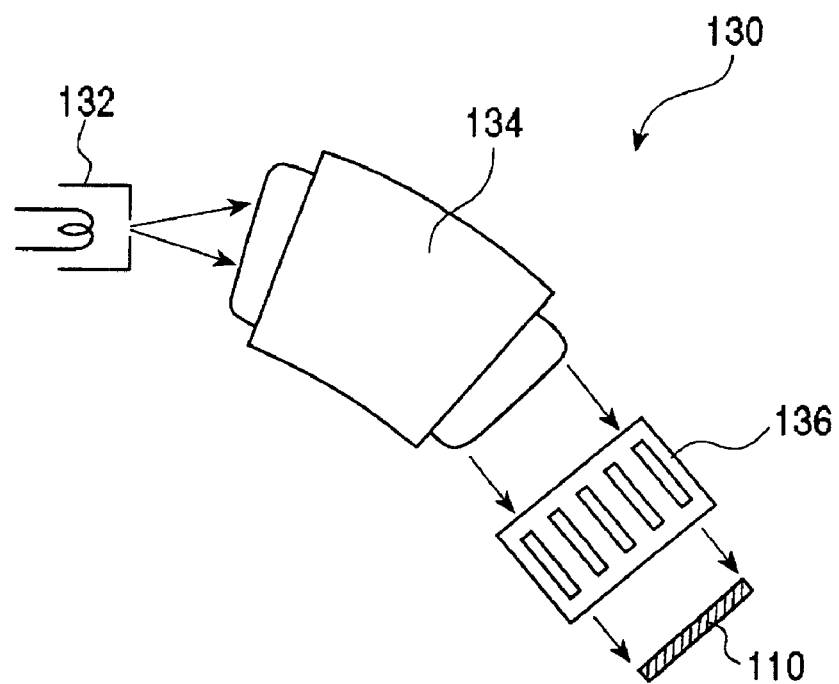
[FIG. 9] A plan view showing an outline configuration of the single-wafer-processing high current ion implanter of the third conventional example.
Figure 10:
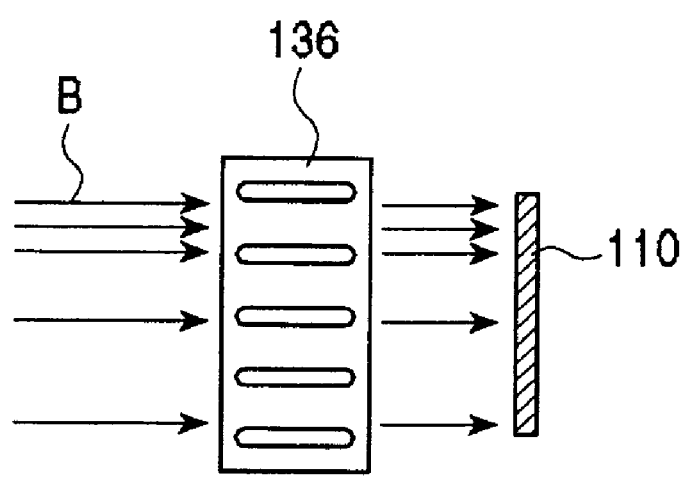
[FIG. 10] A plan view of the single-wafer-processing high current ion implanter of the third conventional example for explaining the principle to control a density distribution of an ion beam, when the density of the ion beam in the upper portion in the drawing sheet is higher than that in the bottom portion.
Figure 11:
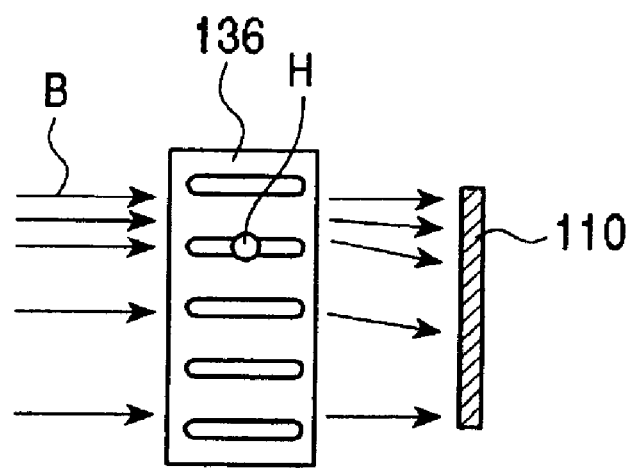
[FIG. 11] A plan view of the single-wafer-processing high current ion implanter of the third conventional example for explaining the principle to control a density distribution of an ion beam, when a density control electromagnet adjusts so that the density distribution becomes uniform.
Figure 12:
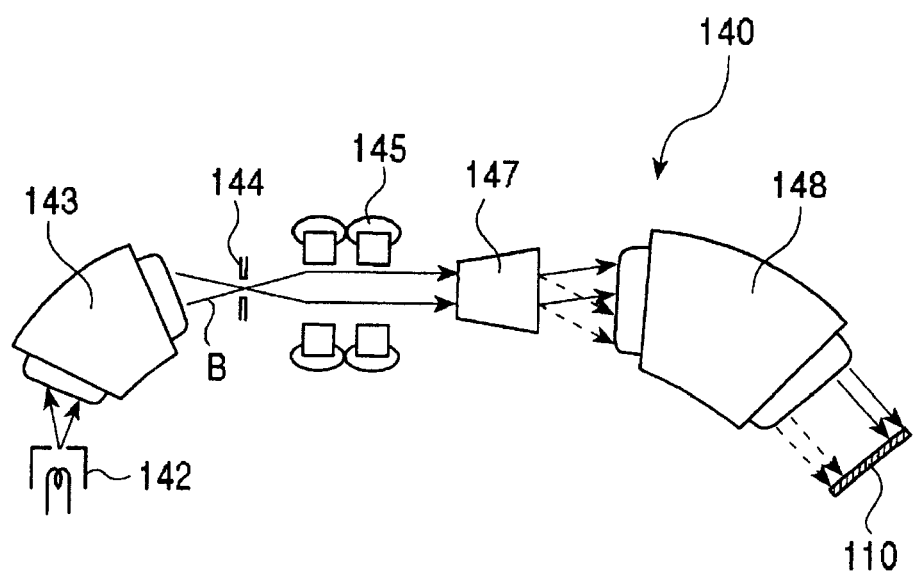
[FIG. 12] A plan view showing an outline configuration of the batch-processing high current ion implanter of the fourth conventional example.

10: Ion Implanter
12: Ion Source
14: First Sector Electromagnet (Mass Separator)
16: Scanner
18: Second Sector Electromagnet (Collimator Device)
20: Substrate
B: Ion beam (ion)
F1: Entrance side focal point of first sector electromagnet
F2: Entrance side focal point of second sector electromagnet
D1: Entrance side focal point of deflection surface of first sector electromagnet
D2: Entrance side focal point in surface that intersects perpendicularly with deflection surface of first sector electromagnet

The invention claimed is:

1. An ion implanter for manufacturing a single crystal film comprising:
   an ion source that outputs hydrogen ions or rare-gas ions;
   a mass separator including:
      a deflection surface, and
      a surface perpendicular to the deflection surface,
      the mass separator selecting desired ions output by the ion source, and wherein the ion source is positioned at entrance side focal points of both said deflection surface in said mass separator and said surface perpendicular to the deflection surface in said mass separator, to thereby output a substantially parallel ion beam of ions;
   a scanner that scans said ions output from the mass separator; and
   a collimator that collimates said scanned ions from the scanner, and implants them into a substrate for manufacturing a single crystal film.

2. An ion implanter according to claim 1, wherein a first sector electromagnet is used as said mass separator and a second sector electromagnet is used as said collimator device.

3. An ion implanter according to claim 1, wherein an aperture of an extraction section of said ion source is circular.

4. An ion implanter according to claim 2, wherein an aperture of an extraction section of said ion source is circular.

* * * * *